United States Patent [19]
Winer et al.

[11] Patent Number: 5,210,766
[45] Date of Patent: May 11, 1993

[54] LASER CRYSTALLIZED CLADDING LAYERS FOR IMPROVED AMORPHOUS SILICON LIGHT-EMITTING DIODES AND RADIATION SENSORS

[75] Inventors: Kris A. Winer, Livermore; Robert L. Thornton, East Palo Alto, both of Calif.

[73] Assignee: Xerox Corporation, Stamford, Conn.

[21] Appl. No.: 866,737

[22] Filed: Apr. 10, 1992

Related U.S. Application Data

[62] Division of Ser. No. 634,896, Dec. 27, 1990, Pat. No. 5,162,239.

[51] Int. Cl.[5] .............................................. H01S 3/17
[52] U.S. Cl. ...................................... 372/40; 372/45; 257/52; 257/53; 257/79
[58] Field of Search ................. 372/40, 45; 357/2, 17; 257/52, 53, 79

[56] References Cited

U.S. PATENT DOCUMENTS

| 4,609,407 | 9/1986 | Masao et al. | 372/40 |
| 4,914,490 | 4/1990 | Takasu et al. | 357/17 |
| 5,051,803 | 9/1991 | Kitamura et al. | 357/2 |
| 5,060,041 | 10/1991 | Haga et al. | 357/2 |
| 5,140,397 | 8/1992 | Haga et al. | 357/2 |

FOREIGN PATENT DOCUMENTS 59-61138   7/1984   Japan .

OTHER PUBLICATIONS

Winer, et al., "Fast-Pulse Excimer-Laser-Induced Processes in a-Si:H", presented at the Materials Research Society Symposium proceedings, Nov. 27, 1989.
Fang, P. H., "Excimer-Laser-Induced Silicon Amorphous-Microcrystalline Transformation and its Solar Cell Applications", Solar Cells, vol. 25, pp. 27-29 (1988).
Hamakawa, et al., "Optoelectronics and Photovoltaic Applications of Microcrystalline SiC", presented at the Materials Research Society Symposium proceedings, Nov. 27, 1989.
Street, "Luminescence in a-Si:H", Semiconductors and Semimetals, vol. 21, Part B, pp. 197-244 (1984).
Sclater, "Gallium Arsenide IC Technology", TAB Professional and Reference Books, Blue Ridge Summit, Pennsylvania, Chapters 1 and 2 (1988).
Winer, et al., "Universal Dopant and Defect Equilibrium Kinetics in n-type a-Si:H", Physical Review B, vol. 40, No. 18, Dec. 15, 1989, pp. 12558-12561.
Kruangam, et al., "Amorphous-Silicon-Carbide Thin Film Light-Emitting Diode", Optoelectronics-Devices and Technologies, vol. 1, No. 1, pp. 67-84, Jun., 1986.
Siebert, et al., "Photoluminescence in $a-Si_{1-x} C_x$:H Films", Phys. Stat. Sol., (b) 140, 311 (1987).
Winer, et al., "Excimer-Laser-Induced Crystallization of Hydrogenated Amorphous Silicon", Appl. Phys. Lett., 57, No. 21; Nov. 19, 1990; pp. 2222-2224.

Primary Examiner—Georgia Y. Epps
Attorney, Agent, or Firm—Townsend and Townsend Khourie and Crew

[57] ABSTRACT

Scanning laser crystallization of p- and n- type hydrogenated amorphous silicon alloy cladding layers enhances the doping efficiency of such layers without changing the luminescence or other important properties of the middle i-layer in a p-i-n device. The dc dark conductivity of the doped layers increases by a factor of about 100 to about 10,000 above a sharp laser energy density threshold whose magnitude increases with decreasing impurity concentration. In one method, a doped amorphous silicon alloy layer is deposited on an amorphous glass substrate, scanned with laser irradiation, and then an intermediate i-layer is formed over this layer. Another doped amorphous silicon alloy layer is deposited on this layer, doped oppositely from the first doped layer. The second doped layer is then crystallized by scanning laser irradiation, leaving the underlying i-layer virtually unchanged in optical and electronic properties.

8 Claims, 5 Drawing Sheets

LASER CRYSTALLIZED CLADDING LAYERS FOR IMPROVED AMORPHOUS SILICON LIGHT-EMITTING DIODES AND RADIATION SENSORS

This is a division of application Ser. No. 07/634,896 filed Dec. 27, 1990, U.S. Pat. No. 5,162,239.

BACKGROUND OF THE INVENTION

This invention relates to laser crystallization of large-area hydrogenated amorphous silicon alloy cladding layers in a p-i-n device structure to reduce defect density in and improve the doping efficiency of the p- and n-type layers.

There are three large-area applications of hydrogenated amorphous silicon and its alloys currently being pursued worldwide. One application is the direct photovoltaic conversion of sunlight into electricity using p-i-n device structures (radiation detection (sensors) of both optical and ionizing radiation). The second is the use of thin film transistor driver arrays. The third is the use of p-i-n arrays for light-emitting diode (LED) devices. The present invention relates to methods which lower the cost of production and increase the efficiency of thin film transistor driver arrays, radiation sensors, and LED's using amorphous silicon and its alloys.

The use of hydrogenated microcrystalline silicon ($\mu$c-Si:H) in such devices is known because of its high conductivity and mobility, which can be orders of magnitude higher than hydrogenated amorphous silicon (a-Si:H), which makes $\mu$c-Si:H, like a-Si:H, a promising candidate for large-area displays and sensors. On the other hand, the low thermal growth rates of $\mu$c-Si:H are undesirable for efficient large-scale device fabrication. As used herein, the terms "large-scale" and "large-area", when referring to techniques and devices, are used interchangeably and refer to techniques and devices which do not require crystalline substrates. Thus, large-area electronics refers to the use of amorphous substrates such as quartz, fused silica or other inexpensive amorphous "glasses." Another disadvantage of $\mu$c-Si:H is that both thermal and plasma enhanced growth of $\mu$c-Si:H alloyed with Group IVa elements such as germanium and carbon, important for many sensor applications to detect certain kinds of radiation, is not completely reliable.

The above mentioned problems with $\mu$c-Si:H in sensor applications have led to the increased use of a-Si:H and its Group IVa alloys in p-i-n sensor structures. A limitation to the performance of such devices is the large defect density in the n- and p-type doped alloy cladding layers. The defect density in a-Si:H and alloys increases in response to dopant incorporation during film growth as a result of defect formation reactions enabled by the disordered amorphous structure. More efficient charge collection and improved device performance might be possible by reducing this defect density without degrading the conductivity of the doped alloy cladding layers or affecting the properties (e.g., photoconductivity, resistivity, etc.) of the amorphous i-layer.

Figure 1A:
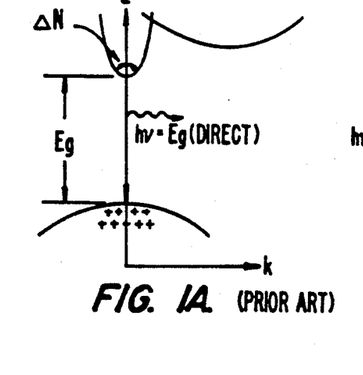
FIGS. 1A and 1B compare direct and indirect band gap materials.
Figure 1B:
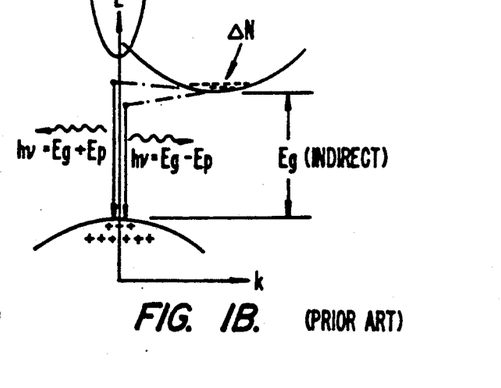

Similar problems exist when a-Si:H alloys are used in thin film transistor arrays or in light-emitting diodes (LED's). Many LED arrays are composed of III-V alloys, such as GaAs, whose direct band gaps make possible efficient radiative emission. FIGS. 1A and 1B compare direct gap (FIG. 1A) and indirect-gap (FIG. 1B) materials. However, indirect-gap materials, such as crystalline silicon, require that phonon emission ($E_p$) or absorption accompany electronic transitions across the band gap ($E_g$) to conserve crystal momentum, which significantly reduces the cross-section for radiative electron-hole recombination. FIGS. 1A and 1B are plots of energy (E) versus crystal momentum (k). Crystal momentum is related to the momentum (p) of an electron by the relation p=hk. Thus, the E versus k diagram is parabolic, since $E \sim ^2/2m$ when k=0, where m is the rest mass of the electron. FIG. 1A shows that direct-gap materials, such as GaAs, are the most efficient radiative emitters. However, the use of III-V alloy-based LED arrays are limited to the four-inch wafer dimension, since it is difficult to obtain defect-free GaAs wafers with diameters greater than four inches.

Figure 2:
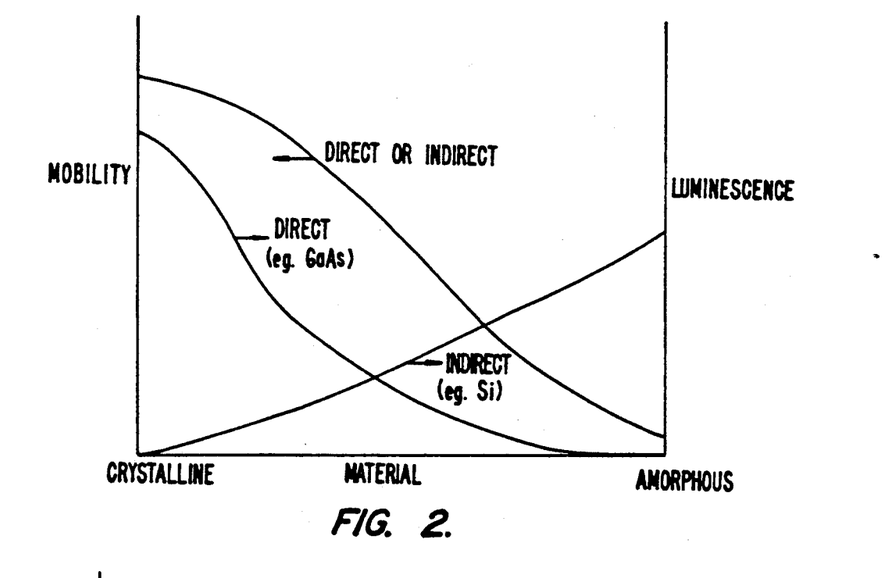
FIG. 2 shows the relationship of mobility, luminescence, and the degree of crystallinity in direct and indirect band gap materials.
Figure 3:
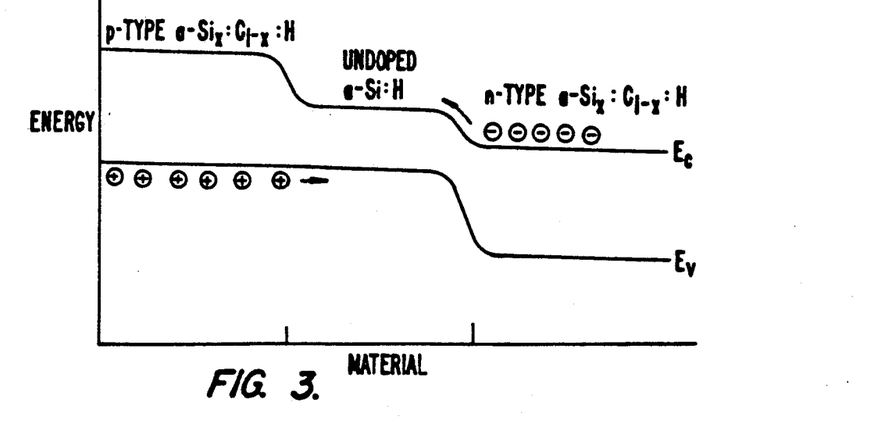
FIG. 3 shows how doped cladding layers having larger band gaps on either side of an undoped layer effect charge carrier recombination efficiency and confinement.

One alternative to III-V alloys in LED structures is amorphous silicon and its alloys, whose intrinsic structural disorder removes the requirement of crystal momentum conservation and thereby leads to enhanced luminescence over that of its crystalline counterpart, as shown in FIG. 2. While the luminescence efficiency is less than in III-V alloy-based LED's, the great advantage of amorphous silicon LED technology lies in the ability to use large-area substrates. One problem hindering this development is the low doping efficiency of amorphous silicon which limits minority injection currents. This deficiency is particularly acute when wide band gap amorphous silicon alloy cladding layers are employed in the p-i-n LED device. As shown in FIG. 3, wide band gap cladding layers are desirable because they allow optical waveguiding due to different refractive indices, improved recombination efficiency in the active layer, electronic carrier confinement in the active layer, and increased LED emission energies from the active layer.

Hamakawa, et al., in their paper "Optoelectronics and Photovoltaic Application of Microcrystalline SiC", MRS Symp. Proc. (1989) disclose an electronic cyclotron resonance (ECR) plasma-enhanced CVD process which forms microcrystalline silicon alloy regions or phases imbedded in amorphous silicon alloy networks. The range of dopant concentration can be very wide. Conductivity values significantly higher than in microcrystalline silicon alloy films produced from conventional plasma-enhanced CVD processes are disclosed. An LED is disclosed, consisting of an amorphous silicon alloy p-i-n junction. To improve the injection efficiency, wide band gap p- and n-type injection materials possessing high conductivity, produced by the ECR plasma CVD process are used.

Fang, Solar Cells, 25 (1988), pages 27-29, discloses an amorphous-microcrystalline transformation in an amorphous silicon surface induced by krypton-fluorine excimer laser radiation. The process uses a single pulse of the excimer laser to produce a doped microcrystalline silicon from a doped amorphous silicon layer. Energy density of the laser used in this process is roughly 5,000 mJ/cm$^2$.

U.S. Pat. No. 4,609,407, issued to Masao et al. discloses irradiating with a ruby laser, at an energy density ranging from 1000-3000 mJ/cm$^2$, either in a pulse or continuous-wave mode, an amorphous silicon layer which is either doped or undoped. The amorphous layer is underlaid by a single crystalline silicon layer. By irradiating the amorphous layer with the laser, the amorphous layer is melted and recrystallized, induced by the single crystal silicon underlayer.

Other references which may be relevant include Street, R. A., *Luminescence in a-Si:H, Semiconductors and Semimetals*, Vol. 21, part B, pp. 197-244, Academic Press, Inc. (1984); Kruangam et al., *Amorphous Silicon-Carbide Thin Film Light Emitting Diode. Optoelectronics*, Vol. 1, No. 4, pp. 67-84, Jun., 1986, MITA Press; and Seibert et al., *Photoluminescence in a-Si$_{1-x}$C$_x$:H Films. Phys. Stat. Sol.* (b) 140, 311, (1987).

It would be advantageous to develop a simple and inexpensive technique for enhancing the doping efficiency of the p- and n-type a-Si:H alloy cladding layers in a p-i-n device structure, useful in thin film transistor arrays as sensors or light-emitting diodes, without affecting the i-layer photoconductivity, resistivity, radiation detection, luminescence, and other properties. It would further be advantageous to decrease the defect densities in p- and n-layers of p-i-n sensor devices without affecting the recombination properties of the i-layer.

SUMMARY OF THE INVENTION

It has now been discovered that crystallization (also known as "annealing") of hydrogenated amorphous silicon alloy p- and n-cladding layers of a p-i-n device under the proper conditions can result in a lower defect density, enhanced charge transport properties, and enhanced doping efficiency of these layers, without significantly affecting the intermediate i-layer luminescence, radiation detection, photoconductivity, resistivity, and other properties. The method involves selectively crystallizing the p- and n-layers by scanning irradiation while maintaining the integrity of the a-Si:H i-layer, to produce p-i-n devices having unique properties and structures. This is accomplished by three related methods.

In the first technique, the top cladding layer can be crystallized by scanning radiation impinging onto the top surface of the device before the top contact is deposited. With the use of suitable amorphous substrates transparent to the radiation, the bottom cladding layer can be crystallized using backside illumination. The bottom cladding layer may be crystallized simultaneously with the top layer or independently thereof.

In the second method, scanning radiation crystallization of the first cladding layer takes place prior to deposition of the intrinsic middle layer and second cladding layers. Then the top cladding layer is crystallized, also by scanning radiation.

Finally, the third method relies on the fact that the rate of crystallization is greatly enhanced by the presence of dopants in the p- and n-hydrogenated amorphous silicon alloy layers. Therefore, very low power scanning irradiation of the surface can crystallize both the n- and p-type cladding layers in a thin p-i-n device, while affecting the i-layer only slightly. As long as the radiation power is low enough to maintain sufficient disorder in the i-layer, the luminescence efficiency is not seriously degraded. This method eliminates the requirement for a transparent substrate by allowing both cladding layers to be processed by top surface irradiation.

One advantage to each method is the fact that the active i-layer electronic and radiation characteristics would remain essentially unaffected by the processing because the depth of crystallization can be precisely controlled by adjusting the radiation source power and dwell time. Further, the large-area capability of hydrogenated amorphous silicon alloy deposition by typical CVD processes (e.g. plasma enhanced, magnetron enhanced CVD) and the use of inexpensive, large, amorphous substrates can be coupled with the efficient crystallization of hydrogenated amorphous silicon alloys using scanning irradiation. The resulting materials retain the large-area, low-temperature processing advantages of hydrogenated amorphous silicon alloys while the carrier concentrations and mobilities are greatly improved over those in the amorphous starting material. Also, application of the methods of this invention leads to efficient hydrogenated amorphous silicon alloy-based LED arrays of any desired dimensions with output over a wide spectral range (1.3-3.0 eV) which is less expensive and as reliable as current print array technologies based on crystalline substrates.

Further features and advantages of the methods will become apparent from the description which follows, which, when taken together with the accompanying drawings and examples, illustrate the invention.

DESCRIPTION OF PREFERRED EMBODIMENTS

Figure 4:
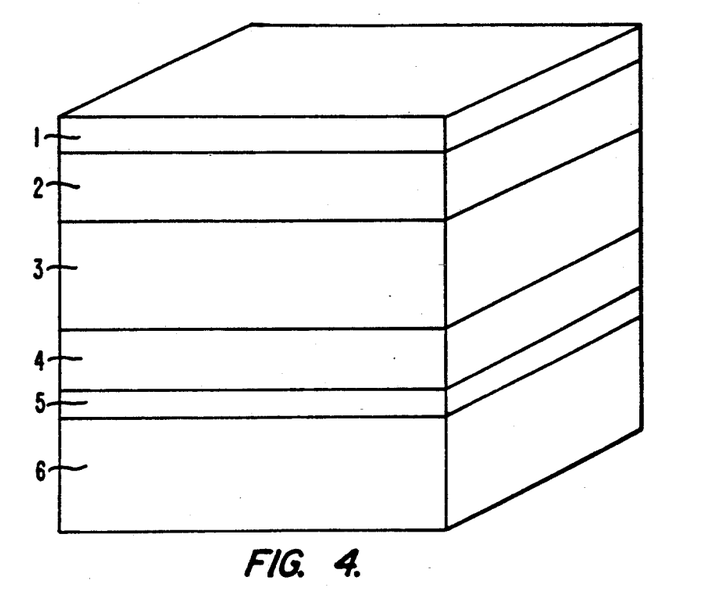
FIG. 4 shows a typical large-area double heterojunction p-i-n device supported by an amorphous substrate in accordance with the present invention.

FIG. 4 shows one preferred double heterojunction a-Si:H-based p-i-n device structure. The device includes a top contact 1 deposited on a p-type cladding layer 2, an intrinsic or lightly doped middle active layer 3, and an n-type cladding layer 4. Completing this embodiment are bottom contact 5 and amorphous substrate 6. The layers 1-6 are specifically described hereinafter and in Example 1. It should be pointed out that the type of doping in the layers denoted 2 and 4 may be reversed in physical orientation. Since the diffusion length (average distance that an electron or hole travels in minority regions before combining) is substantially less for holes than for electrons, the preferred structure for detectors has the p-type layer on top (toward the incident radiation), as is known in the art. See for example, Luxon and Parker, *Industrial Lasers and Their Applications*, Prentice-Hall, Inc., pages 62–67 (1985).

The top contact 1 and bottom contact 5 are preferably chrome or ITO (indium tin oxide), although other electrical conductors, such as aluminum or TCO (transparent conductive oxides) may be used. The bottom contact 5 is deposited directly onto amorphous substrate 6, via electron beam in the case of ITO, while top contact 1 is deposited directly on top of p-type layer 2.

The device shown in FIG. 4 preferably has hydrogenated a-$Si_x$:$C_{1-x}$ p- and n-type layers 2 and 4, respectively. Other Group IVa elements can be alloyed with silicon, such as germanium. Carbon and germanium are preferred as they have the same diamond crystal structure as silicon. The value of x typically ranges from about 1.0 to about 0.6, more typically ranging from about 0.9 to about 0.7.

The intrinsic i-layer 3 is shown sandwiched between p- and n- type layers 2 and 4, respectively. This effectively increases the volume of depletion regions formed in a normal pn device. The undoped or slightly doped hydrogenated amorphous silicon layer 3 has a smaller band gap than the adjoining p- and n- type cladding layers 2 and 4. This was shown in reference to FIG. 3, wherein wide-band gap cladding layers were shown desirable as they allow optical wave guiding, improved recombination efficiency in the active i-layer, and increased LED emission energies from the active i- layer.

Thicknesses of the respective layers 2, 3 and 4 shown in FIG. 4 may vary or be the same, as a particular device or material constraint allows. In actual usage, there is a compromise between device and material constraints. For surface emitting device structures, efficient performance is seen with intrinsic layers of about 800 Å, with the p- and n-type layers being thicker than this. However, thicknesses in these ranges often require appreciable injection current for radiation emission, or electron-hole recombination. Therefore, for material reasons, thin layers on the order of 100 Å for the active i-layer and 200 Å for the p- and n- cladding layers would appear reasonable. However, while the current density is high, the luminescence properties of the active i-layer suffers, due primarily to the fact that electrons and holes may diffuse further than the diffusion length. For these reasons, it is preferable to use i- type layers having thicknesses ranging from about 350 Å to about 450 Å, with the p- and n-type cladding layers 2 and 4 respectively ranging in thickness from about 150 Å to about 250 Å. Most preferable is a device as shown in FIG. 4 having amorphous cladding layers 2 and 4 having thicknesses ranging from about 180 Å to about 220 Å, and an intrinsic layer 3 having a thickness ranging from about 375 Å to about 425 Å. Different relative thickness ranges may be appropriate for edge emitting device structures.

The term "hydrogenated" amorphous silicon and its alloys refers to amorphous silicon alloy films deposited by the RF glow discharge decomposition of pure or dopant-gas-diluted silane or undoped silane onto glass or quartz substrates. In prior art studies of amorphous silicon melting, ion implantation is used to "amorphize" the top surface of a crystalline silicon layer. "Doping" refers to introducing impurities, primarily group V elements phosphorous (P), arsenic, and antimony, and the group III element boron (B). The group V elements produce n-type doped layers, while boron produces p-type layers. Doping and hydrogenation can be achieved during the RF glow discharge process. Doping can also be achieved by ion implantation techniques. See, for example, *V.L.S.I. Technology*, McGraw-Hill, edited by Sze, pages 107–108, and chapter 6 (1983). However, it may be difficult to achieve desired impurity concentration profiles by ion implantation. Uniform impurity concentrations can be varied controllably over several orders of magnitude in a-Si:H by gas-phase doping. Therefore, hydrogenated amorphous silicon and alloys are preferred. The term "alloy" as used herein refers to substitutional solid-solution of group IVa elements as discussed, supra.

Cladding layer dopant concentrations of at least about 0.04 percent mole fraction (i.e. atomic percent) are preferred in all embodiments. Especially preferred are dopant concentrations ranging from about 0.04 percent mole fraction to about 3 percent mole fraction (e.g., 0.0004 mole fraction = 0.04 atomic percent). It should again be noted that the amorphous alloy cladding layers can have either the same or different dopant concentrations. Preferred n-type dopant is phosphorous, while boron is the preferred p-type dopant.

One method in accordance with the present invention includes increasing the conductivity of p- and n- type hydrogenated amorphous silicon alloys in a p-i-n device as shown in FIG. 4, without substantially affecting the photoconductivity, resistivity, radiation detection, and other properties of the intermediate i-type hydrogenated amorphous silicon layer, by using steps including:

(a) forming a first doped hydrogenated amorphous silicon alloy layer on an amorphous substrate, having a preselected concentration of dopant;

(b) forming an intrinsic hydrogenated amorphous silicon layer over the layer of step (a);

(c) forming a second doped hydrogenated amorphous silicon alloy layer over the intrinsic hydrogenated amorphous silicon layer, having a preselected concentration of dopant;

(d) irradiating the layers formed from steps (a)–(c) with a scanning radiation source of predetermined wavelength;

(e) adjusting the energy density of said radiation source so that the rate of crystallization of the layers formed in steps (a) and (c) is substantially greater than the rate of crystallization of the intrinsic layer formed in step (b); and (f) terminating said irradiating when said first and second hydrogenated amorphous silicon alloy layers are substantially crystallized and said intrinsic hydrogenated amorphous silicon layer is essentially amorphous.

As stated previously, in all methods described herein, the (a) and (c) cladding layer alloys are preferably silicon alloyed with an element selected from the group consisting of carbon and germanium. The preferable heterojunction p-i-n structure has the p- and n-type layers having identical amount and type of alloy in each layer, although different alloys with differing amounts of alloying element will be appreciated to be within the scope of the present invention.

A second method in accordance with the present invention of increasing the conductivity of p- and n- type hydrogenated amorphous silicon alloy regions in a p-i-n device includes the steps of:

(a) forming a hydrogenated amorphous silicon alloy n- or p-type region on an amorphous substrate;

(b) irradiating said n- or p-type region with a scanning laser, thereby crystallizing said region to a known degree and increasing the conductivity of the n- or p-type layer;

(c) forming an i-type hydrogenated amorphous silicon region having a predetermined luminescence over said n- or p-type region;

(d) forming a p- or n-type hydrogenated amorphous silicon alloy region doped oppositely from that of step (a) over said i-type region; and (e) irradiating said region formed in step (d) with a scanning laser, thereby crystallizing the p- or n- type region to a known degree and increasing the conductivity of the p- or n-type layer without substantially affecting the i-type region.

A third method in accordance with the present invention of increasing the conductivity and mobility of the p- and n- type hydrogenated amorphous silicon alloy regions in a p-i-n device includes the steps of:

(a) forming a hydrogenated amorphous silicon alloy n- or p-type region on a transparent amorphous substrate;

(b) forming a hydrogenated amorphous silicon i-type region having a predetermined luminescence over said n- or p-type region;

(c) forming a hydrogenated amorphous silicon alloy region doped opposite of the layer formed in step (a) over said i-type region; and (d) irradiating both of said n- and p-type hydrogenated amorphous silicon alloy regions with a scanning laser, thereby crystallizing the n- and p- type regions to a known degree and increasing the conductivity of said p- and n-type layers without substantially affecting the i-type region. The first of the methods of increasing the conductivity of the amorphous cladding layers takes advantage of the fact that the crystallization rate is greater in doped layers than in the intrinsic or lightly doped middle layer. The second method of the invention crystallizes the first deposited cladding layer, then deposits the intermediate intrinsic layer on top of the crystallized first cladding layer, and then deposits the second cladding layer on top of the intrinsic layer, and crystallizes this second cladding layer. Finally, the third method takes advantage of "transparent" amorphous substrates which are particularly preferably in the method of the present invention, wherein the p-i-n device is irradiated from substantially opposite directions, that is, with radiation substantially normal to the top and bottom layers and in opposite directions. As used herein, the term "transparent" means transparent at least to the incident radiation wavelengths, not necessarily visible wavelengths.

In the first method, that of irradiating the whole p-i-n device, irradiation is carried out in a fashion which substantially leaves the i-layer luminescence, photoconductivity, resistivity, and other properties unaffected. Therefore, when a sufficiently high conductivity has been achieved in the cladding layers, the scanning radiation can be terminated well before the intrinsic layer is crystallized. This "energy density threshold" is that energy density where a very large change in conductivity is observed indirectly via Hall mobility measurements. The scanning radiation source used int he first described method is preferably a pulse excimer laser with pulse time ranging from about 1 to about 100 nanoseconds. The scanning radiation source may also include a continuous wave scanning laser or a broad-band spectral source with a programmable anneal. An example of the latter are high-intensity lamps. In the preferred embodiment of the invention the scanning radiation source is a pulsed excimer laser with pulse times ranging from about 10 ns to about 25 ns, scanning at about 512 to about 2560 pulse per point, at a frequency ranging from about 24 to about 40 Hz. The wavelength of the scanning excimer laser preferably ranges from about 155 nm to about 250 nm, depending on the type of excimer laser used. The major types of excimer lasers are well known and are given in the following table:

TABLE I*

| Type | Wavelength (nm) |
|---|---|
| $F_2$ | 157 |
| ArF | 193 |
| KrCl | 222 |
| KrF | 249 |
| XeCl | 308 |
| XeF | 350 |

*From Understanding Lasers, Hecht, page 214 (Howard W. Sams & Company, publisher, 1988).

Most particularly preferred for this invention is the XeCl excimer laser operating at 308 nm, having a pulse time ranging from about 10 to about 25 nanoseconds. The use of an excimer laser facility is preferable in a research laboratory setting which one day may be working with a 308 nm xenon-chloride line, and the next day may need the 193 nm argon-fluoride wavelength. The researcher would pump out the old gas mixture, passivate the tube to remove contaminants, then pump out that mixture and replace it with the new laser gas mixture. This capability, of course, is not essential for industrial applications, and such lasers are often made for a specific gas mixture. Both the research and industrial-type excimer lasers are considered useful in the present invention.

Figure 5:
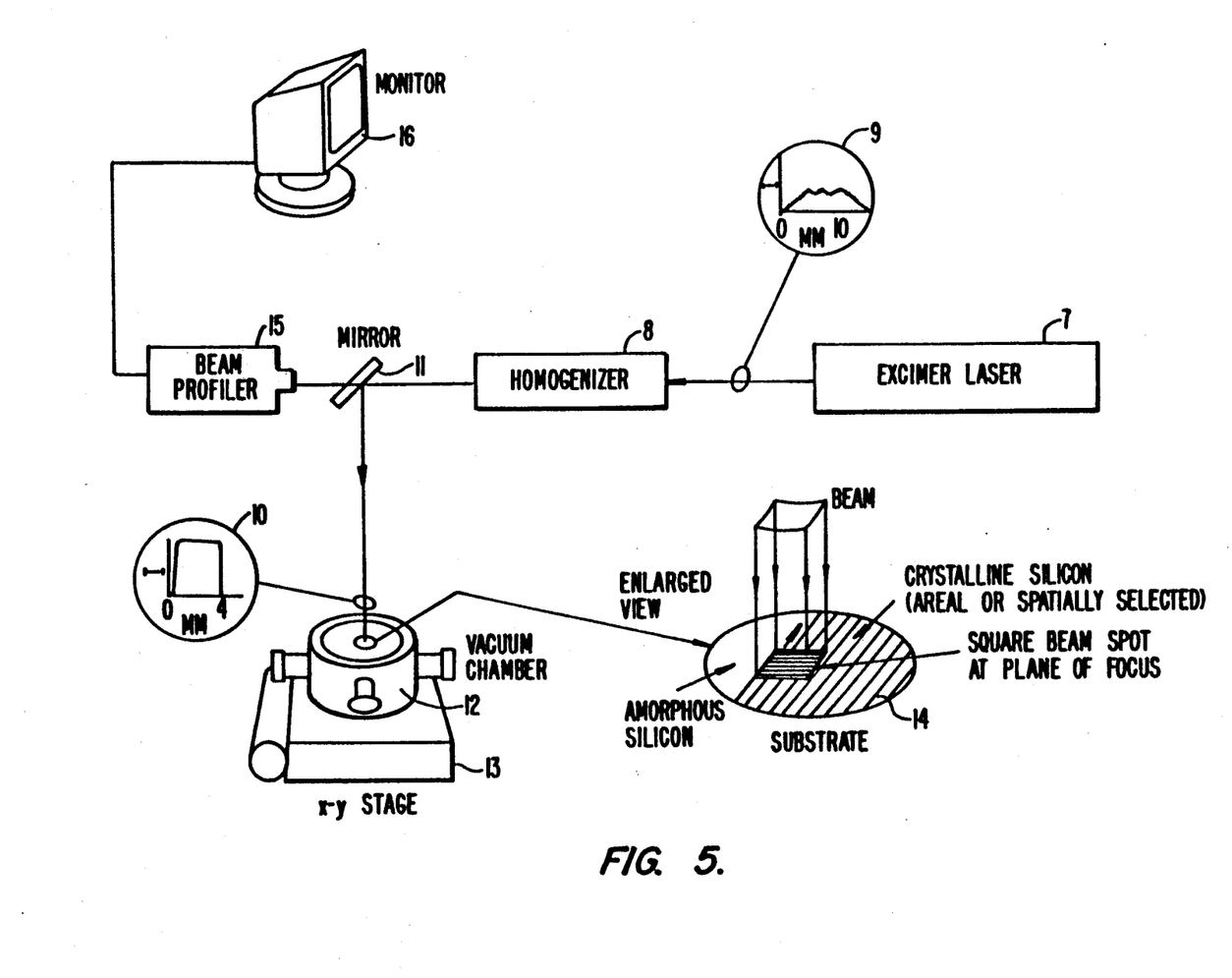
FIG. 5 shows a typical scanning excimer laser irradiation system used in carrying out preferred embodiments of the present invention.

FIG. 5 shows a schematic of a typical excimer laser facility for scanning crystallization of amorphous silicon alloys. Laser 7 is positioned so that its beam passes through beam homogenizer 8, which narrows and collimates the beam. Typical "before" and "after" beam profiles are shown at 9 and 10, respectively. Intensity "I" is plotted qualitatively vs. beam width in millimeters, in profiles 8 and 9. Part of the beam then is reflected by mirror 11 into vacuum chamber 12. In this embodiment, an x-y stage 13 moves substrates 14 so that a scanning beam traverses the substrate, as shown in the enlarged view. Of course, the laser beam could move across a stationary substrate, but the embodiment shown is preferred due to optical alignment of laser, homogenizer, etc. Further peripheral devices include beam profiler 15 and monitor interface 16, which allow a human operator to view the laser beam shape As seen in the enlarged view, preferably a square beam spot is used at the plane of focus. Other beam shapes are possible to effect the scan. For example, rectangular, semi-circular, and ellipsoidal shapes may be employed, as well as combinations of these. It is also possible to envision more than one beam type and amount simultaneously or sequentially scanning the substrate. These variations are, of course, considered within the scope and content of the invention.

Scanning is performed preferably at temperatures ranging from about zero to about 100° C., and at pressures ≦about $1\times 10^{-5}$ torr, at average energy densities ranging from about 50 to about 200 mJ/cm². Particularly preferable are methods wherein scanning is performed at about room temperature (i.e., from about 20° C. to about 25° C.) at pressures about $1\times 10^{-6}$ torr, at average energy densities ranging from about 75 to about 200 mJ/cm². As more clearly articulated in the examples that follow, the room temperature dark dc conductivity of P-doped a-Si:H and its alloys exhibit a well-defined laser energy density threshold (about 85 mJ/cm²) at which the conductivity increases by several orders of magnitude. The laser energy density threshold increases as the gas phase mole fraction or solid layer mole fraction of dopant decreases Similar behavior is observed in B-doped a-Si:H and it alloys. Increases in conductivity exhibited preferably range from a factor of about 100 to about 10,000 times the conductivity of the originally amorphous layer. In other methods in accordance with this invention, the conductivity exhibits an increase ranging from a factor of about 100 to about 1000 times the conductivity of the originally amorphous layer. The important discovery is that the increase in conductivity is attained at a known energy density threshold which increases as the dopant concentration in the amorphous silicon alloy decreases.

Fast-pulse scanning laser annealing of a-Si:H alloys shares all the important advantages of μc-Si:H, but offers the further advantages of spatial selectivity, the capability of post-deposition processing, and efficient crystallization of amorphous silicon alloys. The dc dark conductivity of laser-annealed, highly-doped a-Si:H alloys increases by a factor of roughly 350 above a sharp laser energy density threshold whose magnitude increases with decreasing impurity concentration and which correlates with the onset of hydrogen evolution from and recrystallization of the near-surface layer.

The invention will be more fully understood with reference to the following examples and experiments. The following examples illustrate the transport properties of laser-scanned phosphorous-doped a-Si:H (but are not intended to limit the invention to that particular material or process). Hydrogenated amorphous silicon alloy cladding layer exhibit similar transport properties after laser scanning.

EXAMPLE I

Production, Transport Properties, and Structure of Laser-Scanned P-Doped a-Si:H 150-nm-thick-high quality a-Si:H films were deposited by the RF glow discharge composition (2 watts, 500K) of phosphine diluted in silane onto 300 nm thick a-SiN$_x$ buffer layers supported by glass substrates. The films were scanned at room temperature, under a pressure $1\times 10^{-6}$ torr vacuum, with 512 or 2560 pulse per point at 24 or 40 Hz, with a XeCl excimer laser (308 nm, 17 ns) at average laser energy densities between 60 and 420 mJ/cm². At this wavelength, the absorption coefficients ($a^{-1}$ is roughly 7 nm) of a-Si:H and c-Si are essentially the same. Chrome contacts were evaporated onto the resulting films in the gap cell configuration for dc conductivity and in the Van der Pauw configuration for Hall mobility measurements. The laser-irradiated a-Si:H films were also characterized by Raman spectroscopy, x-ray diffraction, and transmission electron microscopy (TEM) measurements.

Figure 6:
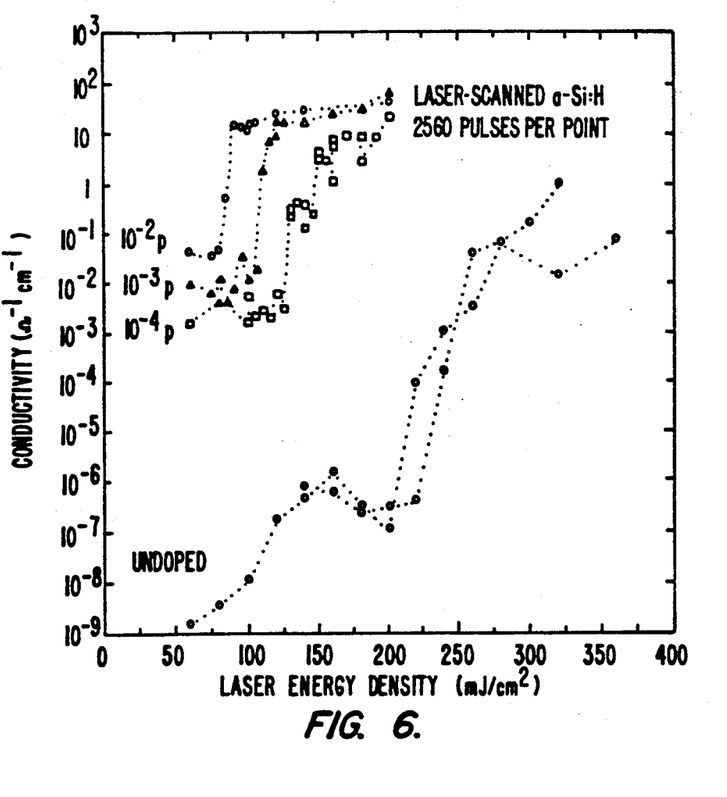
FIG. 6 shows a plot of room temperature, dark dc conductivity of excimer laser-scanned (2560 pulses per point) P-doped a-Si:H for various gas-phase impurity mole fractions and undoped a-Si:H as a function of incident laser energy density, with all values normalized to the nominal 150 nm thickness of the initial amorphous layer.

The transport properties of laser-scanned P-doped a-Si:H are shown in FIG. 6. The room temperature dark dc conductivity of $10^{-2}$ P-doped a-Si:H exhibited a well-defined laser energy density threshold (about 85 mJ/cm²) at which the conductivity increased by several orders of magnitude. The laser energy density threshold increased as the gas phase P mole fraction decreased. Similar behavior was observed in B-doped a-Si:H. The electron Hall mobilities of the P-doped films increased from $+(0.01-0.1)$ to $-(1-5)$ cm²/Vs at the same energy density thresholds. The sign change of the Hall coefficients at threshold indicates that an amorphous to crystalline phase change has occurred in the dominating conducting layer. In undoped a-Si:H, conductivity thresholds were observed at about 120 mJ/cm² and about 240 mJ/cm². The high resistivity of undoped a-Si:H prevented Hall measurements near these thresholds, but the structural morphology of the films allowed a simple interpretation of the behavior.

The structure of the $10^{-2}$ P-doped a-Si:H films was investigated just below, at, and just above the roughly 85 mJ-cm² threshold by Raman, x-ray diffraction, and TEM measurements. The Raman spectra exhibited the sharp peak near 515 cm$^{-1}$ characteristic of crystallized silicon only in films just above threshold ($\geqq 90$ mJ/cm²). X-ray diffraction results showed essentially the same behavior, with the average grain size increasing from the a-Si:H background at and below threshold to about 3 nm just above threshold. TEM micrographs showed the formation of small (1-2 nm diameter) crystallites distributed discontinuously within the first 4-6 nm of the a-Si:H surface just at threshold (85 mJ/cm²). Just above threshold (90 mJ per square centimeter), a continuous surface layer of crystallized a-Si:H was formed whose thickness increased with increasing laser energy density. The increase in the conductivity near threshold is, therefore, a percolation phenomena with the large increase in conductivity arising from the formation of a continuous polycrystalline conduction path with correspondingly enhanced mobility and dopant activation.

The use of the nominal 150 nm film thickness to normalize the conductance in FIG. 6 undervalues the conductivity of the dominant conducting layer above threshold. Taking into account the actual thickness of this layer, about 3 nm, in $10^{-2}$ P-doped a-Si:H just above threshold, its conductivity becomes roughly 500 ohm $^{-1}$cm$^{-1}$. This corresponds to an electron concentration of roughly $1\times 10^{21}$ cm$^{-3}$ (compared to roughly $3\times 10^{17}$ cm$^{-3}$ in the amorphous phase), which is near the phosphorous solubility limit at the c-Si melt temperature and approaches 100% phosphorous activation. The entire a-Si:H film was transformed into a continuous, large-grained (about 100 nm diameter) polycrystalline layer above about 400 mJ/cm². At intermediate energy densities, heterogenous layers formed composed of large polycrystals near the surface due to regrowth from the melt, which were separated from the remaining amorphous material by a layer of smaller microcrystallites and microvoids characteristic of explosive crystallization.

Figure 7:
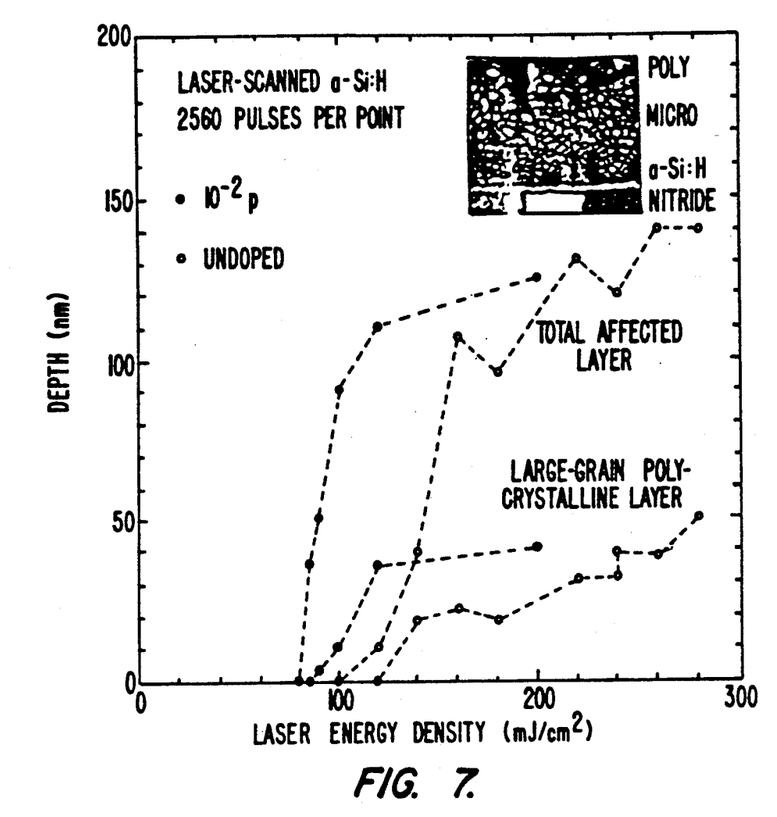
FIG. 7 shows crystallization depth of excimer laser-scanned (2560 pulses per point) $10^{-2}$ P-doped and undoped a-Si:H as a function of incident laser energy density.

The development of these heterogenous layers, determined from cross-sectional TEM micrographs, is shown in FIG. 7. The polycrystalline and total crystallized depths have been interpreted as primary and secondary melt depths, respectively. Both the primary and secondary melt depths increased rapidly above the laser energy density threshold for enhanced transport in $10^{-2}$ P-doped a-Si:H. Similar behavior was observed in nominally undoped a-Si:H, except that the crystallization thresholds occurred at higher laser energy densities. The second conductivity enhancement threshold from about $10^{-7}$ ohm$^{-1}$cm$^{-1}$ at 200 mJ/cm$^2$ to about $10^{-1}$ ohm$^{-1}$cm$^{-1}$ at 260 mJ/cm$^2$ in undoped a-Si:H (FIG. 6) is due not to an increase in melt depth, but to an increase in lateral grain growth and grain quality. This was clear from visual inspection of the TEM micrographs; the roughly $10^6$ increase in carrier mobility corresponded to a similar decrease in the intergranular defect concentration.

The effect of impurities on the melt temperature was negligible for $X_P \leq$ to 0.04% (i.e., $[P] \leq 2 \times 10^{19}$cm$^{-3}$, corresponding to $10^{-4}$ P-doped a-Si:H) which agreed with the onset of the impurity-induced enhancement of the solid-phase epitaxial (SPE) growth rate of amorphized silicon.

EXAMPLE II

The Role of Hydrogen in Crystallization and the Effect of Laser Scanning on the Melt Threshold There are at least three plausible mechanisms for the decrease in the primary melt threshold of a-Si:H with increased impurity concentration: 1) an increased rate of hydrogen diffusion; 2) an electrochemical lowering of nucleation barriers, both kinetic processes, or 3) increased concentration of melt nucleation sites at impurities. Two aspects of laser-induced a-Si:H crystallization are of interest in this regard: the role of hydrogen in the crystallization process and the effect of laser scanning on the melt threshold.

Figure 8:
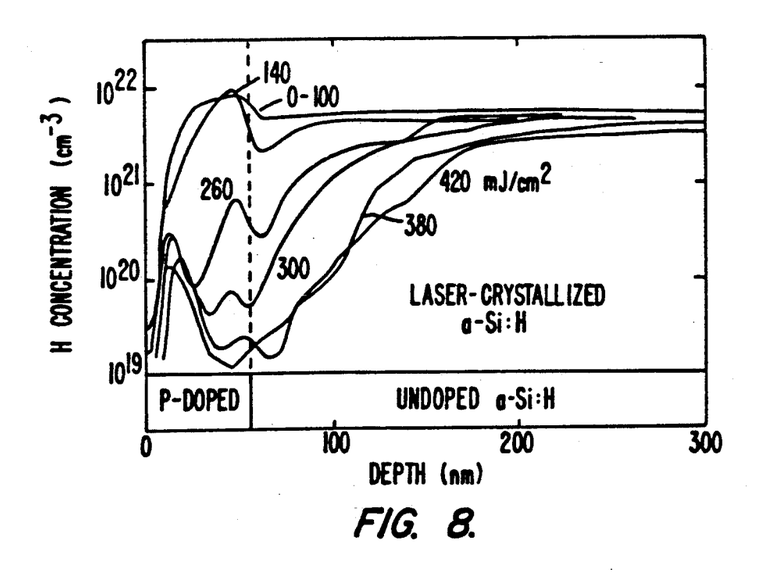
FIG. 8 shows a plot of hydrogen concentration versus depth (hydrogen concentration depth profiles) at various laser energy densities for single pulse irradiation, showing that, at higher laser energy densities, the P-doped layer becomes depleted of hydrogen as crystallite formation proceeds.

The H concentration depth profiles for single pulse irradiation are shown in FIG. 8. (It should be pointed out that multiple pulses may also be used in these methods. For the multiple pulse mode, a stream of pulses ranging from about 0 to about 200 pulses/sec, preferably ranging from about 20 to about 50 pulses/sec, may be used.) The H concentration was slightly higher in the near-surface P-doped a-Si:H layer than in the undoped a-Si:H bulk, where $[H] \approx 5 \times 10^{21}$ cm$^{-3} = 0.1[Si]$. As observed for P, no change in the H concentration depth profile was observed below an energy density of 140 mJ/cm$^2$. At 140 mJ/cm$^2$, the H concentration near the P-doped/undoped interface became enhanced relative to that in the remaining P-doped layer. At still higher laser energy densities the P-doped layer became increasingly depleted of H as crystallite formation proceeded. Interestingly, H appeared to become trapped at the surface and P-doped/undoped interfaces even after H depletion, and presumably crystallization, extended deep into the undoped layer.

H depletion of the near-surface clearly accompanied large grain polycrystallite formation. TEM micrographs showed that the microcrystalline layer between the polycrystalline near-surface and the amorphous bulk contained a large concentration of microvoids, which most likely resulted from H$_2$ gas bubble formation. The polycrystalline layer can only increase in thickness if H in this defective microcrystalline layer can diffuse through the polycrystalline/melt region and escape to the vacuum during laser annealing.

The changes in the H and P concentration depth profiles with increasing incident laser energy density corresponded exactly; the initial changes in both began at 140 mJ/cm$^2$ and P diffused into the undoped a-Si:H layer a distance equal to the depth of H depletion. H diffusion out of the heated near-surface region and P diffusion into the undoped a-Si:H layer were both driven by chemical potential gradients and enabled by the high temperature for short times of the near-surface melt zone.

Figure 9:
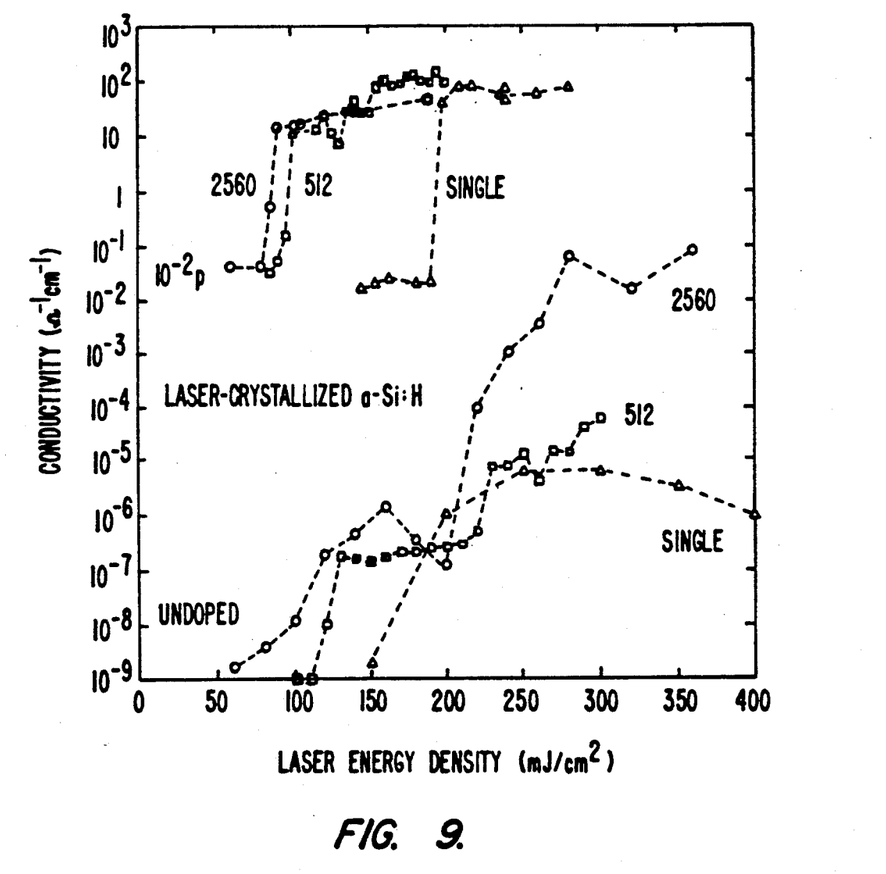
FIG. 9 shows the room temperature, dark dc conductivity of laser-scanned (512 and 2560 pulses per point) and single-pulse $10^{-2}$ P-doped and undoped a-Si:H as a function of incident laser energy density, with all values normalized to the nominal 150 nm thickness of the initial amorphous layer.

The effects of laser scanning compared to single laser pulse irradiation on the crystallization threshold are shown in FIG. 9. Sharp laser energy density thresholds for primary melting occurred at about 120 to about 140 mJ/cm$^2$ for undoped a-Si:H, and about 90 to about 100 mJ/cm$^2$ $10^{-2}$ for P-doped are observed at scanning densities of both 2560 and 512 shots per point. The thresholds for a single-pulse irradiation are also sharp, but both occurred at 200 mJ/cm$^2$, near the laser energy density where significant lateral grain growth in undoped a-Si:H began under scanned conditions. There appears to be no melt threshold reduction due to doping in the single pulse case. Also, the conductivity of undoped a-Si:H did not increase significantly above threshold, and the grains were much smaller and more defective than those produced by scanning at the same laser energy density. A possible explanation of this behavior is that preannealing of the a-Si:H films by the Gaussian tales of the homogenized beam during scanning might aid in the removal of hydrogen with less network disruption.

The preceding examples do not exhaust the variations of use of the inventive process considered to be within the scope of the appended claims. For example, other amorphous substrates than those mentioned herein, particularly transparent amorphous substrates, could conceivably be used, as well as incoherent laser scanning methods. Indeed, to those skilled in the art, many modifications and variations of the present invention are possible in light of the above teachings. It is therefore to be understood that the present invention may be practiced otherwise than as specifically described herein and still be within the spirit and scope of the appended claims.

What is claimed is:

1. A large are p-i-n device comprising:
   an amorphous substrate;
   a first substantially amorphous silicon alloy doped layer on the amorphous substrate, said first substantially amorphous silicon alloy doped layer having a first substantially continuous layer of crystallized amorphous silicon alloy therein having a known thickness;
   an intrinsic substantially amorphous silicon alloy layer formed on the first substantially amorphous silicon alloy doped layer; and
   a second substantially amorphous silicon alloy doped layer formed on the intrinsic layer, the second substantially amorphous silicon alloy doped layer having a second substantially continuous layer of crystallized amorphous silicon alloy therein having a known thickness.

2. A device in accordance with claim 1 wherein the crystallized amorphous silicon alloy layers have thicknesses ranging from about 1 nm to about 10 nm.

3. A device in accordance with claim 2 wherein the crystallized amorphous silicon alloy layers are located near the surfaces of the first and second substantially amorphous silicon alloy doped layers.

4. A device in accordance with claim 1 wherein the first and second substantially amorphous silicon alloy doped layers exhibit conductivities ranging from a factor of about 100 to about 10,000 times the conductivities of the first and second substantially amorphous silicon alloy doped layers without the substantially continuous layers of crystalline amorphous silicon therein.

5. A device in accordance with claim 1 which is surface emitting.

6. A device in accordance with claim 1 which is edge emitting.

7. A device in accordance with claim 5 having an intrinsic layer thickness ranging from about 350 Å to about 450 Å, and the first and second substantially amorphous silicon alloy doped layers having thicknesses ranging from about 150 Å to about 250 Å.

8. A device in accordance with claim 7 having an intrinsic layer thickness ranging from about 375 Å to about 425 Å, and the first and second substantially amorphous silicon alloy doped layers having thicknesses ranging from about 180 Å to about 220 Å.

* * * * *